(12) United States Patent
Fu

(10) Patent No.: US 9,086,857 B2
(45) Date of Patent: Jul. 21, 2015

(54) FASTENING DEVICE FOR EXPANSION CARD

(71) Applicants: HONG FU JIN PRECISION INDUSTRY (ShenZhen) Co., LTD., Shenzhen (CN); HON HAI PRECISION INDUSTRY CO., LTD., New Taipei (TW)

(72) Inventor: Li-Ren Fu, Shenzhen (CN)

(73) Assignees: HONG FU JIN PRECISION INDUSTRY (ShenZhen) Co., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 385 days.

(21) Appl. No.: 13/727,526

(22) Filed: Dec. 26, 2012

(65) Prior Publication Data

US 2014/0166600 A1 Jun. 19, 2014

(30) Foreign Application Priority Data

Dec. 18, 2012 (CN) .......................... 2012 1 0550787

(51) Int. Cl.
G06F 1/18 (2006.01)
A47B 81/06 (2006.01)
H05K 7/14 (2006.01)

(52) U.S. Cl.
CPC ............... *G06F 1/186* (2013.01); *A47B 81/068* (2013.01); *H05K 7/1404* (2013.01)

(58) Field of Classification Search
CPC ......... G06F 1/185; G06F 1/186; G06F 1/187; H05K 7/1429; H05K 7/1402; H05K 7/1404; H05K 7/1405; H05K 7/1409; A47B 81/068
USPC ............. 211/41.17; 361/679.32, 679.58, 759, 361/788, 798, 801, 802
See application file for complete search history.

(56) References Cited

U.S. PATENT DOCUMENTS

| | | | |
|---|---|---|---|
| 7,525,815 B2 * | 4/2009 | Chen et al. ..................... | 361/788 |
| 8,514,585 B2 * | 8/2013 | Zhang et al. .................. | 361/796 |
| 8,559,187 B2 * | 10/2013 | Peng et al. ..................... | 361/801 |
| 8,699,217 B2 * | 4/2014 | Zhou .......................... | 361/679.31 |
| 2011/0157821 A1 * | 6/2011 | Liu et al. ..................... | 361/679.58 |
| 2012/0275129 A1 * | 11/2012 | Peng et al. ..................... | 361/791 |
| 2013/0048814 A1 * | 2/2013 | Zhou .......................... | 248/223.41 |
| 2013/0050937 A1 * | 2/2013 | Zhou .......................... | 361/679.58 |
| 2013/0058054 A1 * | 3/2013 | Zhou .......................... | 361/748 |

* cited by examiner

*Primary Examiner* — Patrick Hawn
(74) *Attorney, Agent, or Firm* — Novak Druce Connolly Bove + Quigg LLP

(57) ABSTRACT

A fastening device for an expansion card includes a first rack, a second rack opposite to the first rack, and a fastener. The first rack defines a first opening. A supporting plate extends from the first rack toward the second rack. A position tab extends up from the supporting plate. The fastener engages with the first rack and comprises a resilient arm. The supporting plate supports a bottom surface of a first end of the expansion card. The position tab is received in a mounting hole defined in the first end of the expansion card. The resilient arm is deformed and extends through the first opening, and is blocked by the first rack and abuts a top surface of the first end of the expansion card. A second end of the expansion card is fastened to the second rack.

8 Claims, 7 Drawing Sheets

FASTENING DEVICE FOR EXPANSION CARD

BACKGROUND

1. Technical Field

The present disclosure relates to a fastening device for fastening an expansion card in place.

2. Description of Related Art

Expansion cards are generally classified either as a full length type or as a half length type. In a server, half of a full length type of an expansion card is generally fastened to a rack and connected to a riser card, and the other half of the full length type of expansion card is cantilevered. The cantilevered end of the expansion card tends to vibrate, which is harmful to data transmission of the expansion card.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean "at least one."

Figure 1:
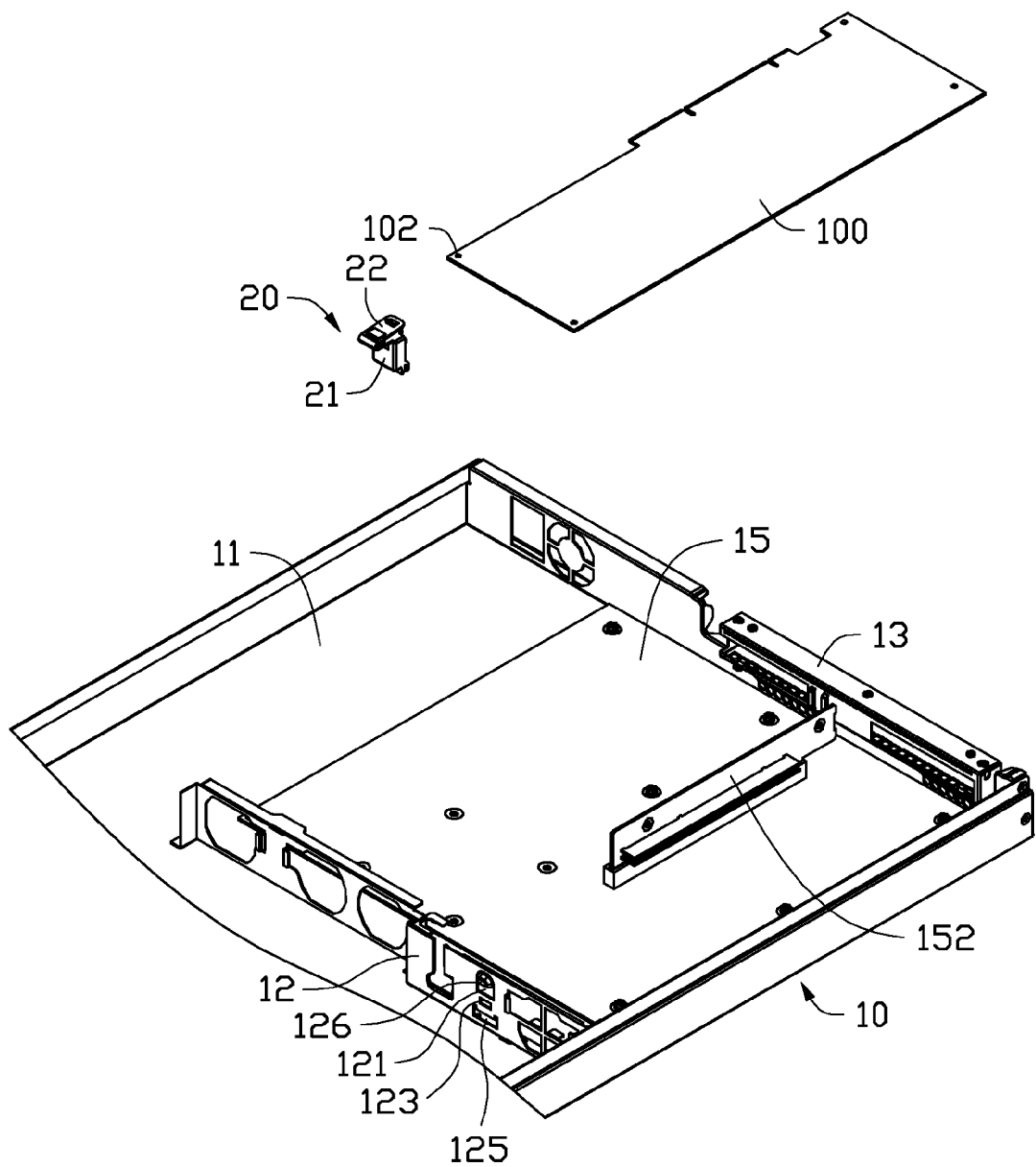
FIG. 1 is an exploded, isometric view of an exemplary embodiment of a fastening device together with an expansion card, wherein the fastening device includes a fastener.
Figure 2:
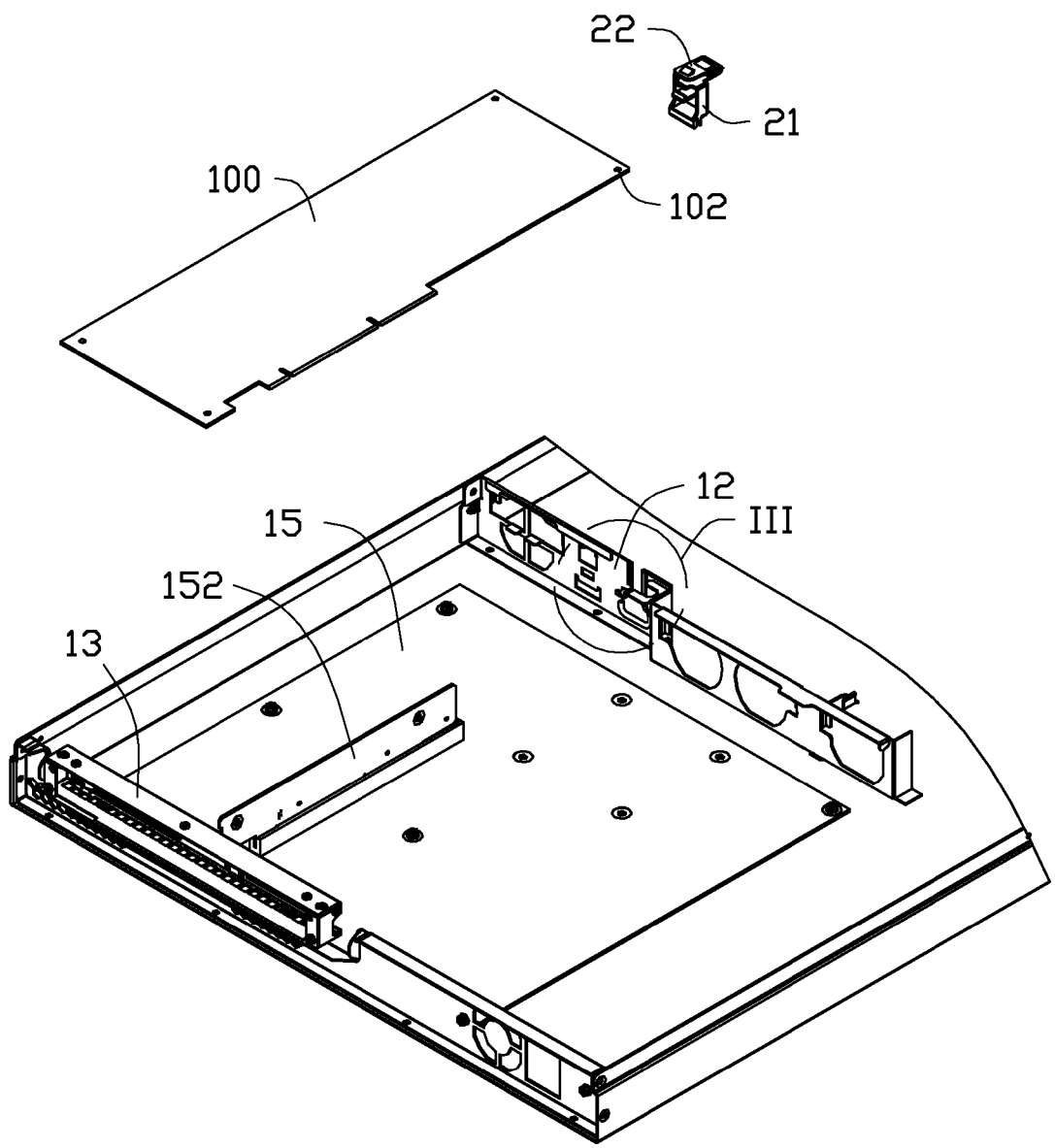
FIG. 2 is similar to FIG. 1, but viewed from another perspective.
Figure 3:
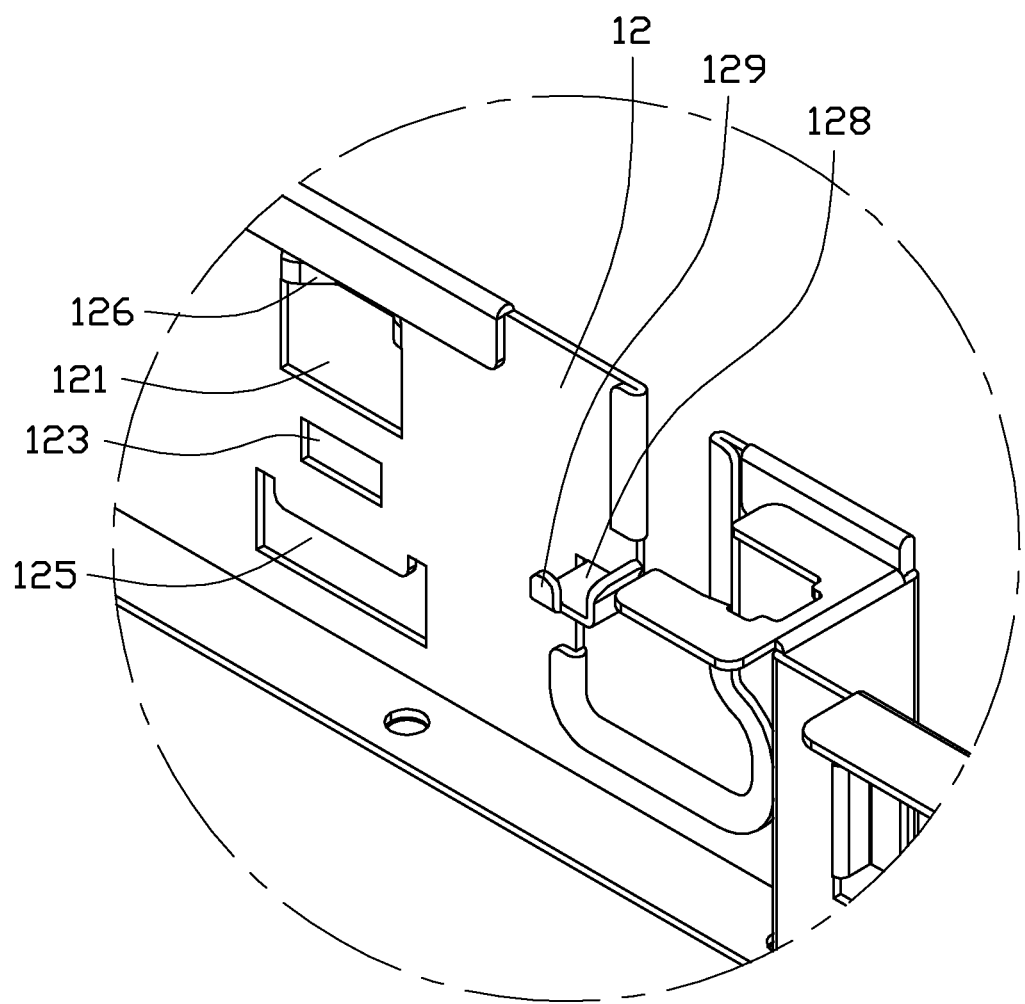
FIG. 3 is an enlarged view of a circled portion III of FIG. 2.

FIGS. 1-3 show an exemplary embodiment of a fastening device for an expansion card 100. The fastening device includes a chassis 10 and a fastener 20.

The chassis 10 includes a bottom plate 11, a first rack 12 extending up from a front end of the bottom plate 11, and a second rack 13 extending up from a rear end of the bottom plate 11. A circuit board 15 is mounted on the bottom plate 11. A riser card 152 is perpendicularly and electrically connected to the circuit board 15, near and substantially perpendicular to the second rack 13. The expansion card 100 can be connected to the riser card 152 to communicate with the circuit board 15. A mounting hole 102 is defined in a front end of the expansion card 100.

A first opening 121, a second opening 123, and a third opening 125 are defined in the first rack 12, located from top to bottom. A protrusion 126 extends forward from the first rack 12, adjoining a top of the first opening 121. A supporting plate 128 extends back from the first rack 12 in a substantially perpendicular manner. A position tab 129 extends up from a rear end of the supporting plate 128.

Figure 4:
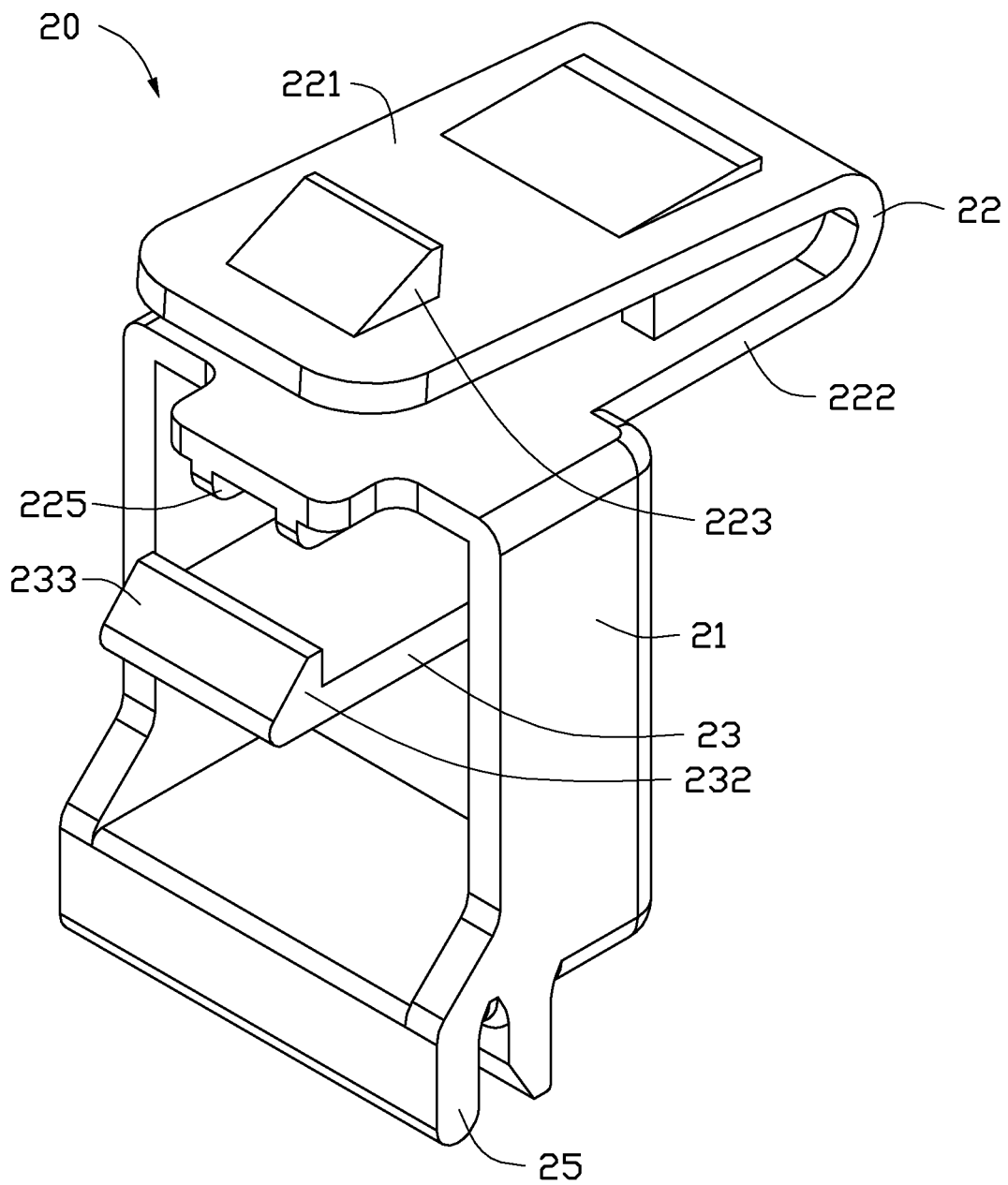
FIG. 4 is an enlarged view of the fastener of FIG. 2.

FIG. 4 shows the fastener 20 including a base body 21 and a resilient arm 22. An L-shaped hook 23 extends back from an upper portion of the base body 21. The hook 23 includes a hooking portion 232 at a distal end of the hook 23. A slanting guiding surface 233 is formed on the hooking portion 232. Two clamp portions 25 extend down from a bottom of the base body 21. The resilient arm 22 is substantially U-shaped and attached to a top of the base body 21, with an opening of the U-shaped resilient arm 22 facing back. The resilient arm 22 includes a first arm 221, and a second arm 222 spaced from and located below the first arm 221. A block 223 protrudes up from the first arm 221, near a rear end of the first arm 221. Two abutting portions 225 protrude down from a rear end of the second arm 222.

Figure 5:
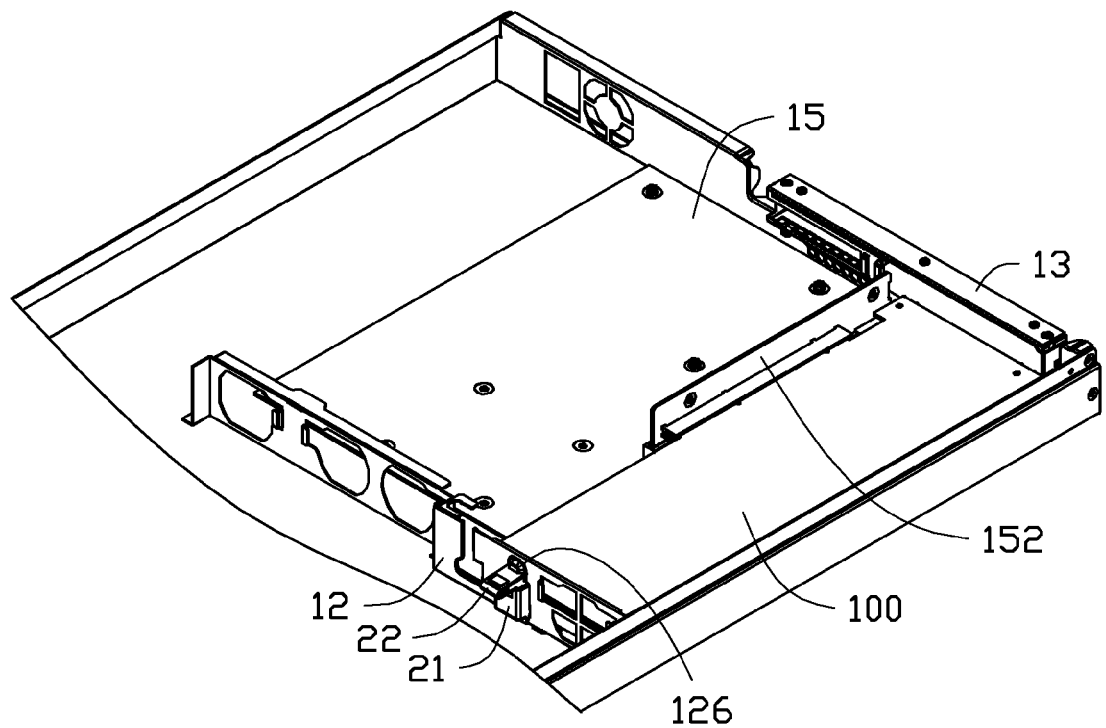
FIG. 5 is an assembled, isometric view of FIG. 1.
Figure 6:
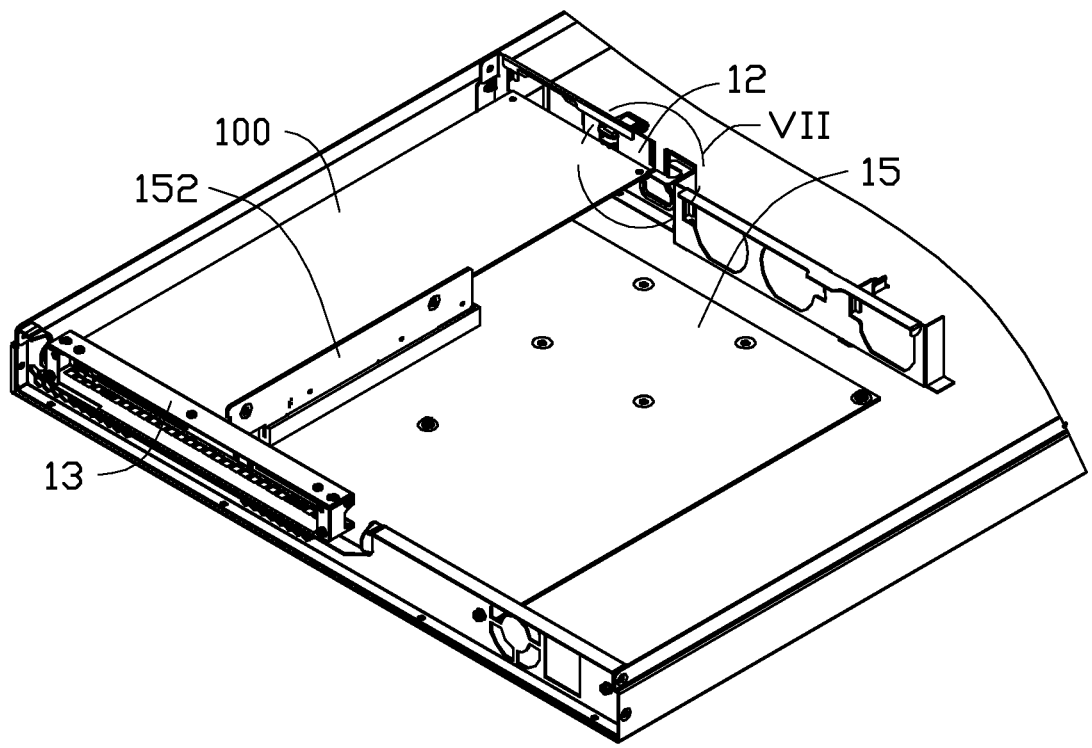
FIG. 6 is an assembled, isometric view of FIG. 2.
Figure 7:
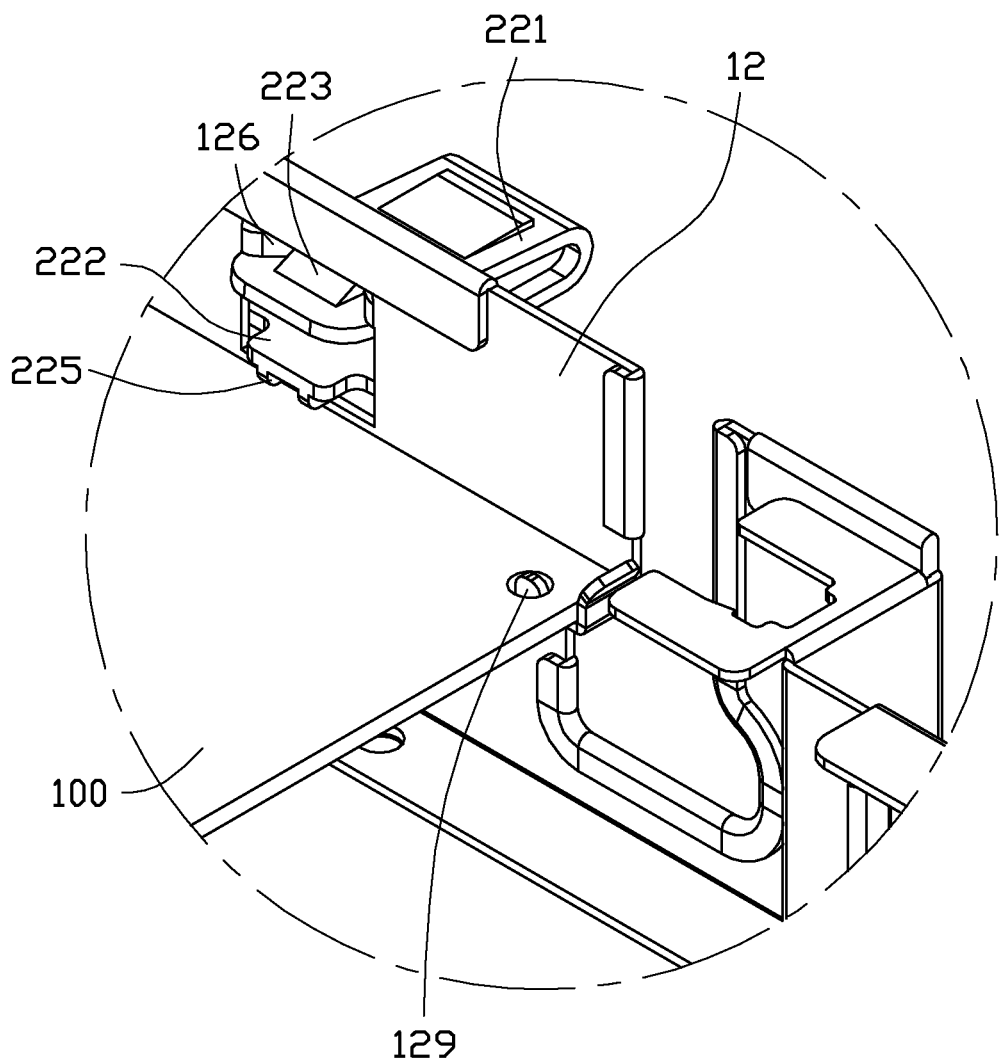
FIG. 7 is an enlarged view of a circled portion VII of FIG. 6.

Referring to FIGS. 5-7, in assembly, the clamp portions 25 sandwich the first rack 12 bounding a bottom side of the third opening 125 from a front side of the first rack 12. Guided by the guiding surface 233, the hook 23 is deformed down and extends through the second opening 123, and the hooking portion 232 is behind the first rack 12 and spaced from the first rack 12. The first arm 221 is manipulated down to make the block 223 align with the first opening 121. The resilient arm 22 is manipulated back, and the block 223 is located behind the protrusion 126. The resilient arm 22 is released to allow the block 223 to abut a rear side of the protrusion 126. Thereby, the fastener 20 engages with the first rack 12.

To fasten the expansion card 100, the first arm 221 is manipulated down. The block 223 aligns with the first opening 121. The resilient arm 22 is manipulated forward. The first arm 221 extends through the first opening 121. The resilient arm 22 is released to allow the first arm 221 to disengage from the first opening 121. At the same time, the hook 23 moves forward, and the hooking portion 232 abuts a rear side of the first rack 12 adjoining a top of the second opening 123 to prevent the fastener 20 from disengaging from the first rack 12. A rear end of the expansion card 100 is inclined away from the riser card 152. The mounting hole 102 is aligned with the position tab 129, and the expansion card 100 is manipulated down, until the expansion card 100 is placed on the supporting plate 128. The position tab 129 is received in the mounting hole 102. The rear end of the expansion card 100 is rotated toward the riser card 152, to connect a corresponding side of the expansion card 100 to the riser card 152. The rear end of the expansion card 100 is fastened to the second rack 13 by screws. The first arm 221 is manipulated down, and the resilient arm 22 is manipulated back, to allow the block 223 to abut the rear side of the protrusion 126. The abutting portions 225 abut a top surface of a front end of the expansion card 100. Thereby, the expansion card 100 is firmly fastened to the first rack 12 and the second rack 13.

Even though numerous characteristics and advantages of the embodiments have been set forth in the foregoing description, together with details of the structure and the functions of the embodiments, the disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A fastening device for an expansion card, comprising:
    a first rack defining a first opening, a supporting plate extending from the first rack in a substantially perpendicular manner, a position tab extending up from the supporting plate;
    a second rack opposite to the first rack, the supporting plate located between the first rack and the second rack; and a fastener engaging with the first rack and comprising a resilient arm;

wherein, in mounting the expansion card, the supporting plate supports a bottom surface of a first end of the expansion card, the position tab is received in a mounting hole defined in the first end of the expansion card, the resilient arm is deformed and extends through the first opening, and is blocked by the first rack and abuts a top surface of the first end of the expansion card, a second end of the expansion card is fastened to the second rack; and wherein the first rack defines a second opening located below the first opening, the fastener further comprises a base body connected to a bottom of the resilient arm, an L-shaped hook extends from the base body and is moveable through the second opening, when the resilient arm disengages from the first opening, the hook abuts the first rack.

2. The fastening device of claim 1, wherein the first rack defines a third opening located below the second opening, two clamp portions extend down from a bottom of the base body, the clamp portions sandwich the first rack bounding a bottom side of the third opening.

3. The fastening device of claim 1, wherein the resilient arm is substantially U-shaped, and comprises a first arm and a second arm located below the first arm.

4. The fastening device of claim 3, wherein a block protrudes up from the first arm, the block abuts a side of the first rack facing the second rack after the resilient arm extends though the first opening.

5. The fastening device of claim 4, wherein a protrusion extends from the first rack and extends away from the second rack, the block abuts a side of the protrusion facing the second rack after the resilient arm extends though the first opening.

6. The fastening device of claim 3, wherein the second arm abuts the top surface of the first end of the expansion card.

7. The fastening device of claim 6, wherein an abutting portion protrudes down from the second arm and abuts the top surface of the first end of the expansion card.

8. The fastening device of claim 1, wherein a circuit board is located between the first rack and the second rack, a riser card is mounted to the circuit board, the expansion card is connected to the riser card.

\* \* \* \* \*